United States Patent
Umebayashi

(10) Patent No.: US 7,297,577 B2
(45) Date of Patent: Nov. 20, 2007

(54) SOI SRAM DEVICE STRUCTURE WITH INCREASED W AND FULL DEPLETION

(75) Inventor: Taku Umebayashi, Harrison, NY (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 323 days.

(21) Appl. No.: 11/027,853

(22) Filed: Dec. 30, 2004

(65) Prior Publication Data

US 2006/0148162 A1  Jul. 6, 2006

(51) Int. Cl.
  *H01L 21/84* (2006.01)
(52) U.S. Cl. ............... 438/155; 438/163; 257/E21.094; 257/E21.104
(58) Field of Classification Search ............... 438/155, 438/163; 257/E21.094, E21.104
  See application file for complete search history.

(56) References Cited

U.S. PATENT DOCUMENTS

| | | | |
|---|---|---|---|
| 5,310,456 A | 5/1994 | Kadomura | 156/657 |
| 5,314,575 A | 5/1994 | Yanagida | 156/651 |
| 5,338,399 A | 8/1994 | Yanagida | 156/662 |
| 5,366,590 A | 11/1994 | Kadomura | 156/662 |
| 5,705,421 A | 1/1998 | Matsushita et al. | 437/62 |
| 5,916,411 A | 6/1999 | Nogami | 156/345 |
| 6,383,907 B1 | 5/2002 | Hasegawa et al. | 438/597 |
| 6,407,011 B1 | 6/2002 | Ikeda et al. | 438/786 |
| 6,562,665 B1 * | 5/2003 | Yu | 438/149 |
| 6,709,982 B1 * | 3/2004 | Buynoski et al. | 438/696 |
| 6,783,644 B2 | 8/2004 | Tonosaki et al. | 204/192.38 |
| 6,787,457 B2 | 9/2004 | Yanagawa et al. | 438/639 |
| 6,867,433 B2 * | 3/2005 | Yeo et al. | 257/67 |
| 7,229,877 B2 * | 6/2007 | Cheng et al. | 438/241 |
| 2004/0259295 A1 * | 12/2004 | Tomiye et al. | 438/155 |
| 2006/0043472 A1 * | 3/2006 | Wang et al. | 257/330 |

* cited by examiner

*Primary Examiner*—Trung Dang
(74) *Attorney, Agent, or Firm*—Mayer & Williams PC; Mark D. Wieczorek, Esq.; Karin L. Williams, Esq.

(57) ABSTRACT

An SOI device, and a method for producing the SOI device, for use in an SRAM memory having enhanced stability. The SRAM is formed with a wider W and a fully-depleted FET. The wider FET is extended by an expitaxial silicon sidewall, and the performance of the FET is improved.

11 Claims, 8 Drawing Sheets

SOI SRAM DEVICE STRUCTURE WITH INCREASED W AND FULL DEPLETION

FIELD OF THE INVENTION

The invention relates to MOSFET device structures, and in particular to SRAM devices employing Silicon-On-Insulator technology.

BACKGROUND OF THE INVENTION

Silicon-On-Insulator (SOI) technology has been investigated for SRAM chips for several years. Advantages of the technology include simplified layout, avoidance of latch-up, reduced leakage currents and junction capacitances, and thus faster speeds and lower power consumption. For memories, the reduction of the junction capacitance lowers the bitline capacitance, which is a major limiting factor in memory performance.

SOI for SRAMs has been investigated in both fully-depleted and partially-depleted processes. The fully-depleted process is more difficult to perform but has certain desired circuit behaviors, including less history dependence and less parasitic bipolar currents. A fully-depleted device has an ultrathin silicon film used such that the depletion layer extends through the entirety of the film, eliminating the floating-body effect and providing superior short-channel behavior.

SUMMARY OF THE INVENTION

In one aspect, the invention is related to a method for producing an SOI device for use in an SRAM memory having enhanced stability over that found in the prior art. The SRAM is formed with a wider W and a fully-depleted FET. The wider FET is extended by an expitaxial sidewall, and the performance of the FET is improved. In another aspect, the invention is related to a product produced by the above method. Advantages will be apparent from the description that follows, including the figures.

Figure 1:
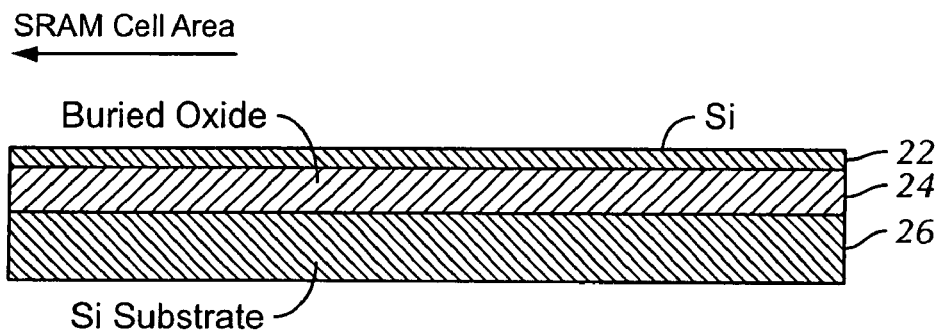
FIG. 1 shows an SOI system on which may be built an SRAM according to an embodiment of the invention.

Note that in all figures, like shading represents like elemental composition or like compounds. Not all elements have reference numerals, for clarity.

DETAILED DESCRIPTION

FIG. 1 shows an SOI system on which may be built devices according to an embodiment of the invention. In particular, a silicon substrate 26 is provided with a buried oxide layer 24, and a silicon thin film 22 is present above the buried oxide layer 24. The silicon thin film 22 is typically less than about 50 nm thick. The thickness of the buried oxide layer 24 may range from about 100 nm to about 200 nm.

The buried oxide layer 24 may be formed in various ways, including via converting the silicon to a silicon oxide ($SiO_2$) using a heavy oxygen implant. Following this, an epitaxial layer may be grown on top of the oxide. In another technique, bonding of different wafers may also be employed. Another technique is via direct deposition on the substrate followed by a recrystallization process to create the silicon thin film 22.

Figure 2:
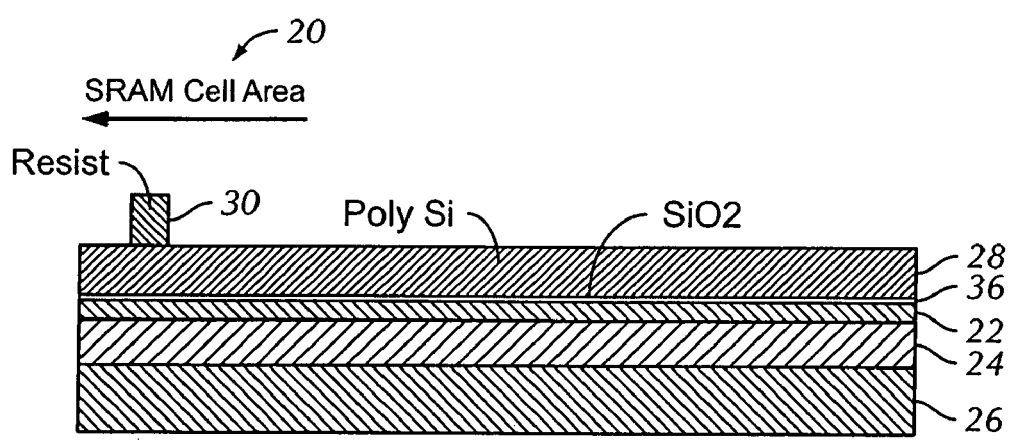
FIG. 2 shows the system of FIG. 1 on which has been deposited a silicon oxide layer, a polysilicon layer, and a resist feature according to an embodiment of the invention.

Referring to FIG. 2, the system of FIG. 1 is shown on which has been deposited a silicon oxide layer 36, a polysilicon layer 28, and a resist feature 30. The silicon oxide layer 36 has a thickness typically in the range from about 5 nm to about 20 nm. The polysilicon layer 28 has a thickness typically in the range from about 150 nm to about 300 nm. The resist feature 30 begins the process of patterning of the polysilicon layer in the SRAM cell area 20.

The silicon oxide layer 36 may be deposited in a number of ways, including via TEOS sources or various types of deposition or thermal growth technologies, including vapor deposition, CVD, etc. The polysilicon layer 28 may be deposited in a number of ways, including via silane processes, LPCVD, etc. The resist feature 30 is applied via known processes.

Figure 3:
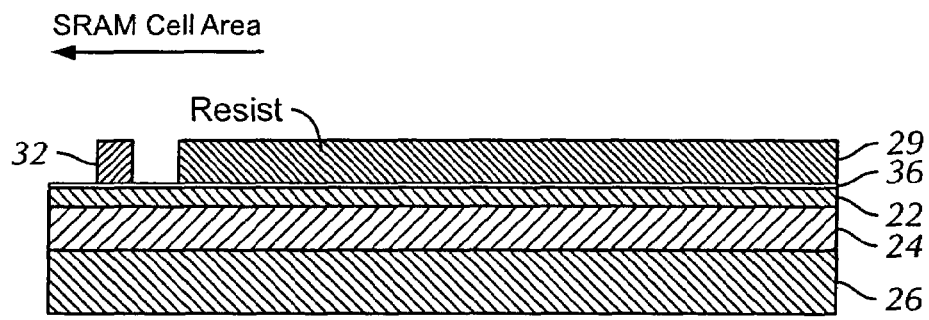
FIG. 3 shows the system of FIG. 2 in which certain of the polysilicon has been removed, and in which more resist has been applied according to an embodiment of the invention.

FIG. 3 shows the system of FIG. 2 in which most of the polysilicon layer 28 has been removed via etching, and in which more resist 29 has been applied. The polysilicon layer 28 may be etched via, e.g., plasma etching or reactive ion etching (RIE), as well as via other techniques. The resist feature 29 is applied via known processes, and in this step the same is applied over most of the logic area. Due to the presence of resist feature 30, polysilicon feature 32 remains following the etching step.

Figure 4:
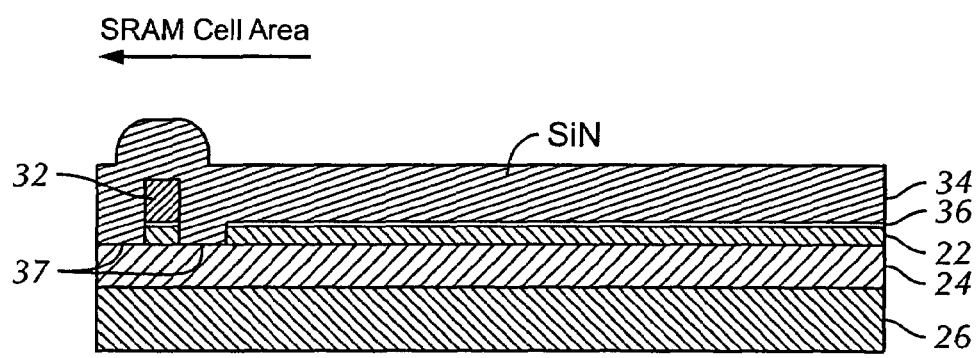
FIG. 4 shows the system of FIG. 3 in which certain areas of the resist have been stripped and a layer of silicon nitride deposited according to an embodiment of the invention.

FIG. 4 shows the system of FIG. 3 in which certain areas of the resist have been stripped and a layer of silicon nitride deposited. In particular, a step of shallow-trench silicon RIE has been performed at the SRAM area, followed by stripping of the resist 29 and deposition of a silicon nitride layer 34. In particular, shallow trench patterning has been applied in the SRAM cell area at locations indicated by trench 37. The silicon nitride layer may be deposited via APCVD, LPCVD, PECVD, etc.

Figure 5:
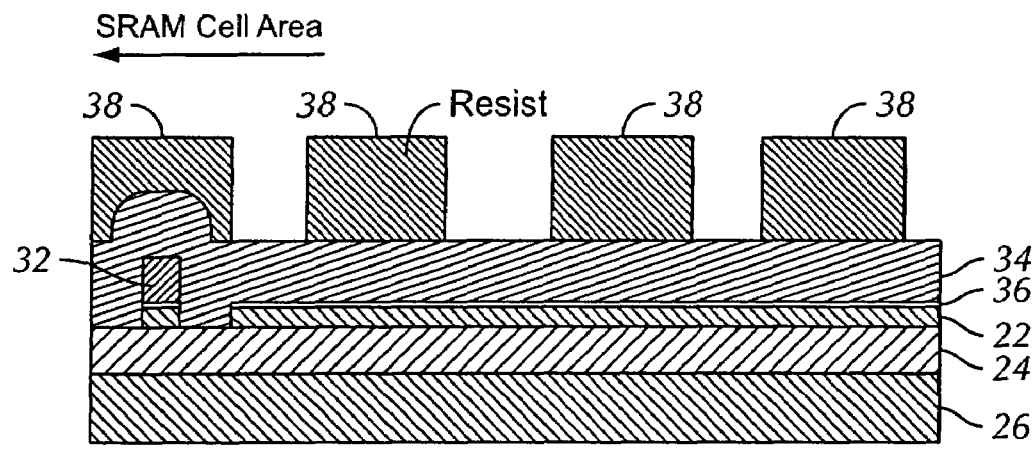
FIG. 5 shows results of shallow trench patterning for the logic area, as well as deposition over the SRAM cell area according to an embodiment of the invention.

FIG. 5 shows results of shallow trench patterning for the logic area, as well as deposition over the SRAM cell area. In particular, a layer of resist 38 is applied and patterned over the top of the SiN layer 34. The resist may be applied and patterned via known processes.

Figure 6:
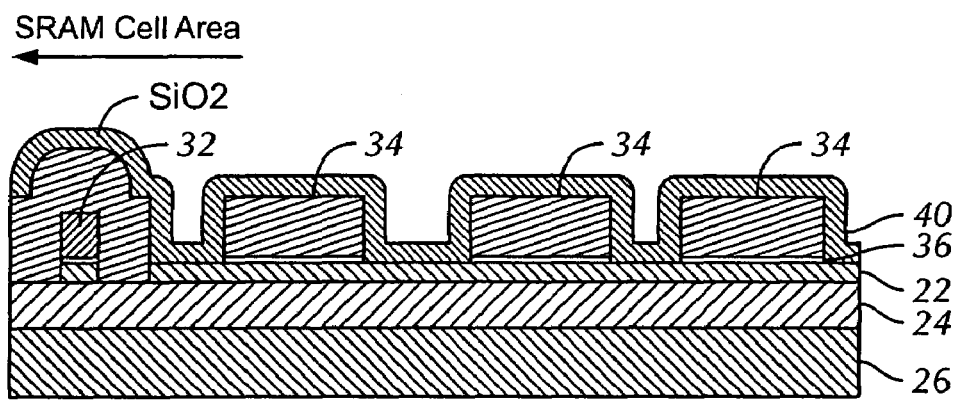
FIG. 6 shows results of a silicon oxide deposition over the logic area according to an embodiment of the invention.

FIG. 6 shows results of a silicon nitride RIE and a silicon oxide deposition over the logic area. In particular, a step of silicon nitride RIE is performed to remove silicon nitride not under the resist. Then, a layer of silicon oxide 40 is deposited over the resulting structure. The thickness of the silicon oxide layer 40 may be from about 50 nm to about 150 nm.

The silicon nitride layer 34 may be etched by RIE or by other techniques as desired. The silicon oxide layer 40 may be deposited in a number of ways, including via TEOS sources or various types of deposition, including vapor deposition, CVD, etc.

Figure 7A:
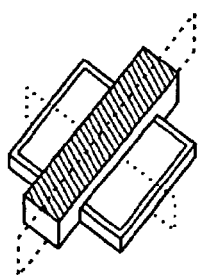
FIG. 7A shows a perspective view of a device according to the embodiment of FIG. 7, showing the (perpendicular) views along which the two center devices in the logic area are taken.
Figure 7:
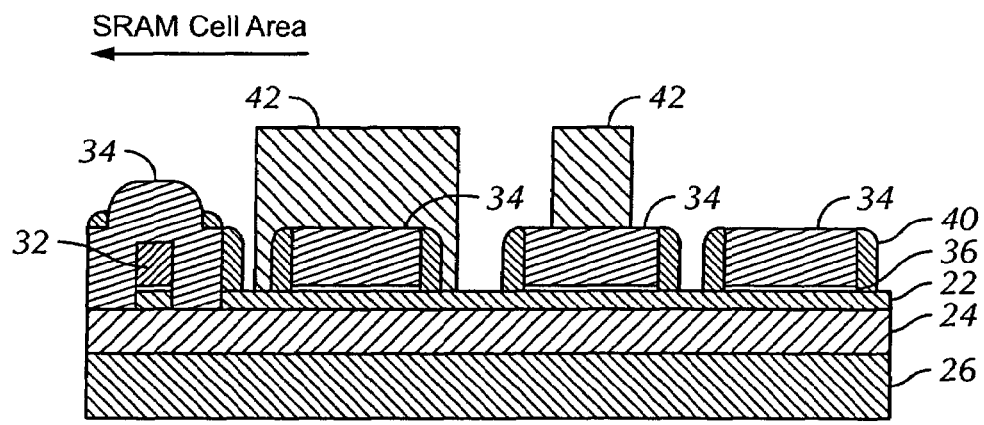
FIG. 7 shows results of a silicon oxide etch back according to an embodiment of the invention.

FIG. 7 shows results of a silicon oxide etch back. In particular, the figure shows that silicon nitride layer 34 has been etched back in certain areas. This etch back may be performed via a SiO2 RIE method. Following the etch back, a layer of resist 42 is applied and patterned in known manner. The SiO2 layer 40 remains only on the sidewall of SiN layer 34. This sidewall may be located beneath the channel.

FIG. 7A shows a perspective view of certain of the devices in the logic area. In particular, it shows two perpendicular views, one each of the two center devices. The view along the length is shown by the leftmost of the center two devices; the cross-sectional view by the rightmost of the center two devices. There are physically at least two such devices in the logic area, but for clarity the two representative and equivalent devices are employed to show the longitudinal and cross-sectional views. It is noted here that the same description applies to FIGS. 8A, 9A, 13A, 14A, and 16A.

Figure 8A:
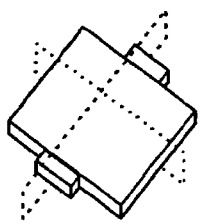
FIG. 8A shows a perspective view of a device according to the embodiment of FIG. 8, showing the (perpendicular) views along which the two center devices in the logic area are taken.
Figure 8:
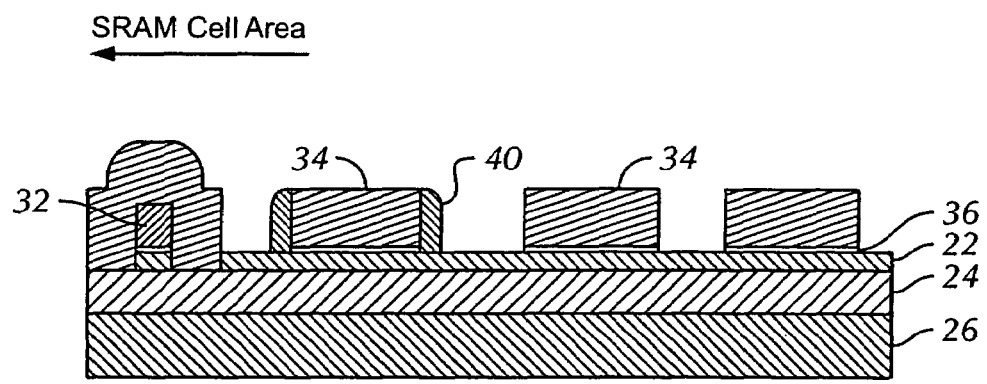
FIG. 8 shows results of a silicon oxide removal according to an embodiment of the invention.

FIG. 8 shows results of a silicon oxide removal step. The resist layer 42 protects the silicon oxide of the leftmost of the center two devices, and so this silicon oxide layer remains. However, the remainder of the silicon oxide has been removed. Following this step, the resist 42 is stripped away.

The removal of the silicon oxide may be performed via an oxide RIE method. Wet techniques may also be used but are more difficult due to the small design.

Figure 9A:
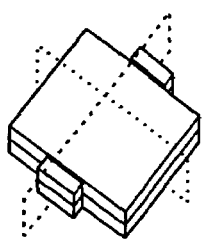
FIG. 9A shows a perspective view of a device according to the embodiment of FIG. 9, showing the (perpendicular) views along which the two center devices in the logic area are taken.
Figure 9:
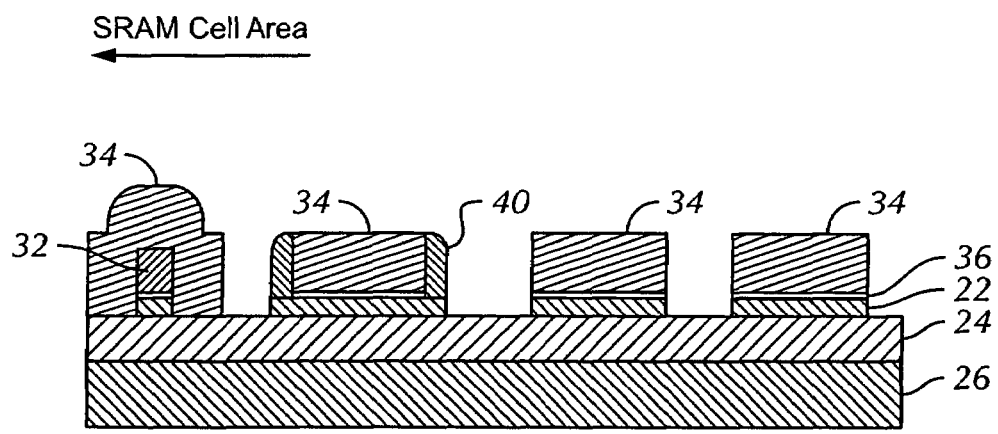
FIG. 9 shows results of a silicon reactive ion etching (RIE) step according to an embodiment of the invention.

FIG. 9 shows results of a silicon reactive ion-etching (RIE) step. In particular, a silicon RIE step is employed to remove the silicon layer 22 as it appears between the devices. As a result, a portion of the buried oxide layer 24 is exposed. As such, the RIE should be anisotropic such that the sidewall of layer 40 is not attacked.

Figure 10:
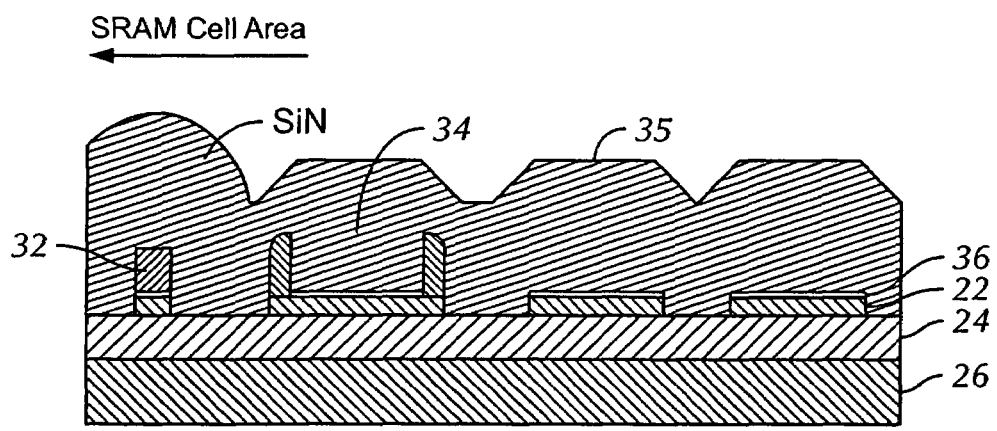
FIG. 10 shows results of a silicon nitride fill according to an embodiment of the invention.

FIG. 10 shows results of a silicon nitride fill. In particular, a thick layer of silicon nitride 35 is deposited over the logic area and SRAM cell area. The silicon nitride layer 35 may be deposited via APCVD, PECVD, etc. The thickness of the silicon nitride layer may be between about 300 nm and 70 nm.

Figure 11:
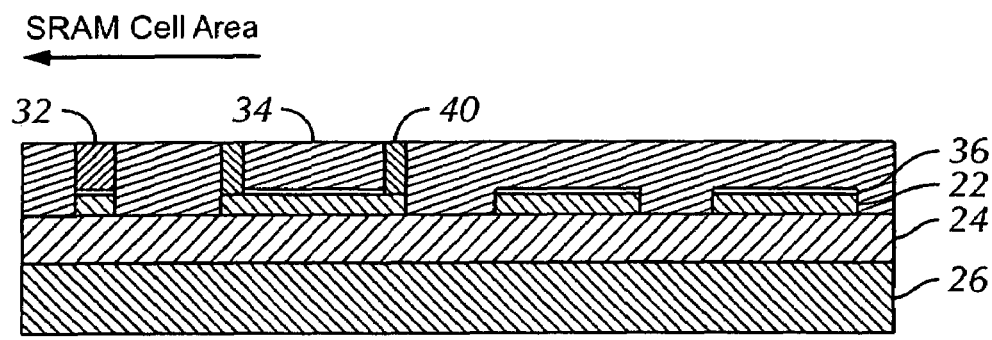
FIG. 11 shows results of a silicon nitride chemical-mechanical-polishing (CMP) step according to an embodiment of the invention.

FIG. 11 shows results of a silicon nitride chemical-mechanical-polishing (CMP) step. This process flattens the wafer surface and in this case removes much of the silicon nitride layer 35. In some cases, an etch back technique may be employed to replace the CMP procedure.

Figure 12:
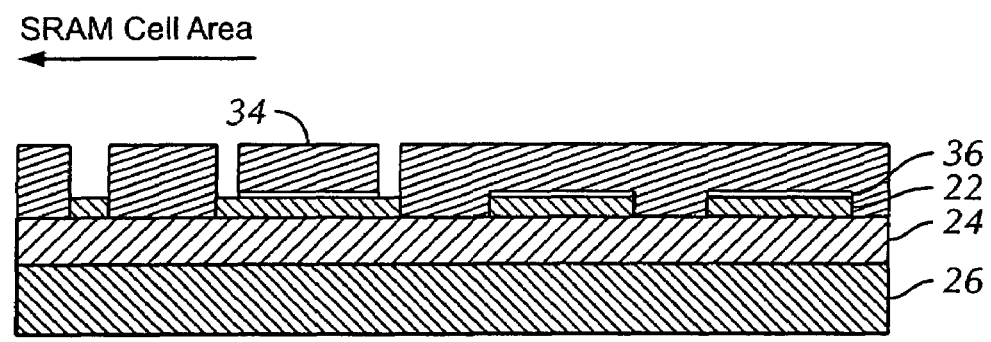
FIG. 12 shows results of polysilicon and silicon oxide removal steps according to an embodiment of the invention.

FIG. 12 shows results of polysilicon and silicon oxide removal steps. In particular, the polysilicon layer 32 has been removed, and the silicon oxide layer 40 has also been removed.

The polysilicon layer 32 may be removed by, e.g., RIE or wet etching. The silicon oxide layer 40 may also be removed by wet etching, such as by a BOE solution. Systems of HF+HNO3+H2O may be employed for removal of the polysilicon layer. Systems of HF+H2O or NH4OH+HF+H2O may be employed for removal of the SiO layer.

Figure 13A:
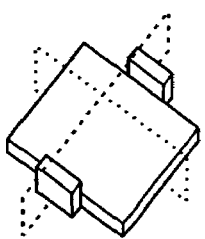
FIG. 13A shows a perspective view of a device according to the embodiment of FIG. 13, showing the (perpendicular) views along which the two center devices in the logic area are taken.
Figure 13:
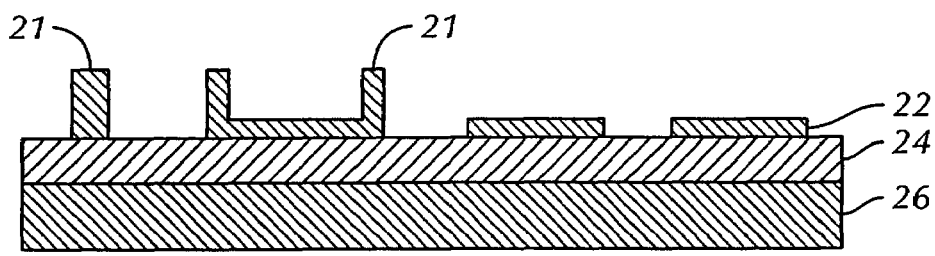
FIG. 13 shows results of a silicon epitaxial growth and CMP, as well as silicon nitride removal, according to an embodiment of the invention.

FIG. 13 shows results of a silicon epitaxial growth and CMP, as well as silicon nitride removal. In particular, silicon epitaxial growth is employed to grow the silicon layer 21. A further step of CMP may then be employed to smooth the wafer top to a planar surface. Finally, the silicon nitride layers 34 and 35 may be removed. Typically, silicon nitride layers may be removed via wet or dry etching.

Figure 14A:
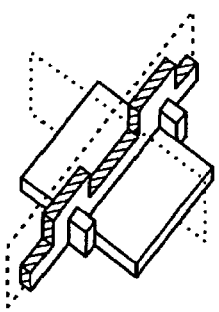
FIG. 14A shows a perspective view of a device according to the embodiment of FIG. 14, showing the (perpendicular) views along which the two center devices in the logic area are taken.
Figure 14:
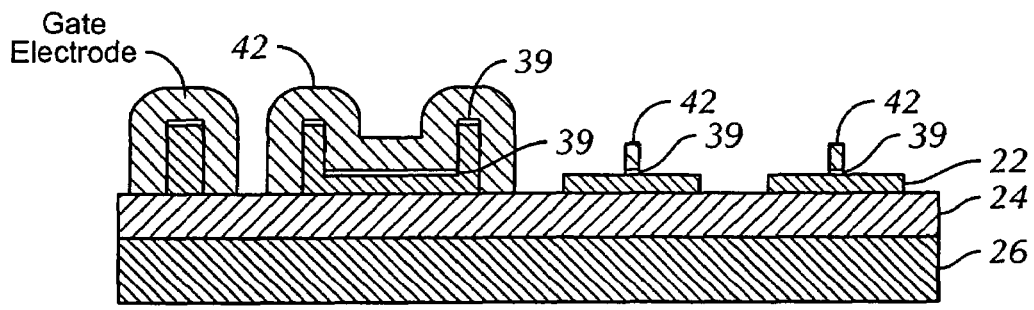
FIG. 14 shows results of MOSFET gate formation according to an embodiment of the invention.

FIG. 14 shows results of MOSFET gate formation. In particular, the gate electrode 42 may be deposited via appropriate masking over the device of FIG. 13. The gate may be of known type, including metal, doped polysilicon, policide, etc. Such gate electrodes are typically deposited in known manner, and typically as thermal oxides. As may be seen, a layer of silicon oxide 39 is formed over certain areas of the surface prior to the gate electrode deposition. The silicon oxide layer 39 may be deposited in a number of ways, including via TEOS sources or various types of deposition, including vapor deposition, CVD, etc. It should be noted that if the gate dielectric is a high-K material, CVD may also be employed to deposit the gate oxide.

Figure 15:
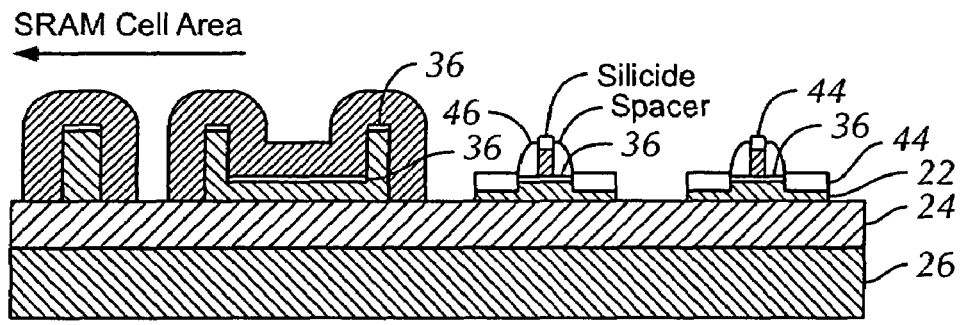
FIG. 15 shows results of MOSFET contact formation according to an embodiment of the invention.

FIG. 15 shows results of MOSFET contact formation. In particular, a spacer layer 46 is deposited in certain areas using appropriate masking. The spacer layer 46 may be formed by CVD, and is generally SiO2 or SiN or both. A silicide layer 44 is then deposited in certain areas via appropriate masking. Silicide deposition is typically performed via PVD (sputtering).

Figure 16A:
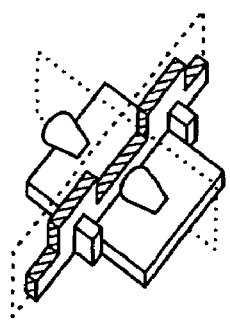
FIG. 16A shows a perspective view of a device according to the embodiment of FIG. 16, showing the (perpendicular) views along which the two center devices in the logic area are taken.
Figure 16:
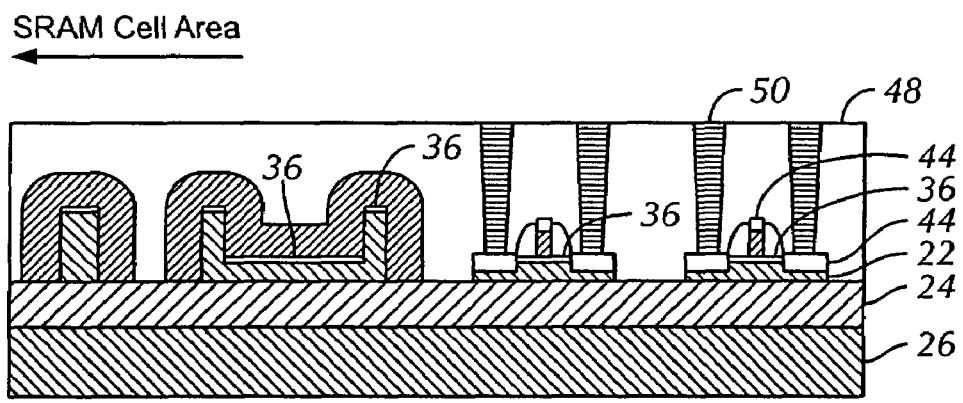
FIG. 16 shows the finished product.

FIG. 16 shows the finished product. In achieving this finished product, contacts 50 and layer 48 are made via an appropriate contact masking process as is known. Layer 48 is typically SiO2, and a CVD method may be used to deposit the same. The contacts 50 may be a W/TiN system, where the TiN is deposited via CVD or PVD and the W by CVD.

The invention has been described with respect to certain embodiments. However, the invention is not to be limited to those embodiments described; rather, the invention is limited solely by the claims appended hereto, and equivalents thereof.

The invention claimed is:

1. A method of making an SOI device with increased channel width in a full-depletion SRAM, comprising the steps of:
   applying a first layer of an oxide to an SOI substrate;
   applying a first layer of polysilicon to the first layer of oxide;
   patterning and etching the first layer of polysilicon to create a first predetermined area substantially corresponding to a SRAM cell area;
   patterning and etching the first layer of an oxide to correspond to a logic area;
   performing shallow trench silicon RIE at the SRAM cell area;
   depositing a first layer of a nitride over the SRAM cell area and the logic area;
   performing RIE over the logic area;
   depositing a second layer of an oxide over the SRAM cell area and the logic area;
   etching back the second layer of an oxide over the SRAM cell area, between a plurality of device areas in the logic area, and between the SRAM cell area and the adjacent device area;
   removing the exposed oxide over the SRAM cell area and around the sides of each of the plurality of devices;
   performing silicon RIE between the plurality of device areas in the logic area and between the SRAM cell area and the adjacent device area;
   depositing a second layer of a nitride over the SRAM cell area and the logic area;
   performing a first chemical mechanical polishing step to remove all the deposited second layer of a nitride down to about a top edge of the remaining first polysilicon layer;
   removing the first polysilicon layer;
   removing the exposed silicon oxide layer;
   epitaxially growing a first layer of silicon into the voids created by the steps of removing the first polysilicon layer and removing the exposed silicon oxide layer;
   performing a second chemical mechanical polishing step to remove all the deposited first layer of a silicon down to about the same level as the first chemical mechanical polishing step;
   removing the second nitride layer;
   depositing a third oxide layer over the SRAM cell area and over a portion of each of the plurality of device areas;
   depositing a gate electrode substantially over the third oxide layer;
   depositing a spacer layer adjacent the gate electrode and third oxide layer;
   depositing a silicide layer on the exposed first epitaxial silicon layer and over a portion of the gate electrode; and
   depositing contacts, each of said contacts in electrical connection with one of the silicide layers.

2. The method of claim 1, wherein the oxide layers are silicon oxides.

3. The method of claim 1, wherein the nitride layers are silicon nitrides.

4. The method of claim 2, wherein the silicon oxide is SiO2.

5. The method of claim 3, wherein the silicon nitride is SiN.

6. A method of making an SOI device with increased channel width in a full-depletion SRAM, comprising the steps of:
   applying a first layer of silicon oxide to an SOI substrate;
   applying a first layer of polysilicon to the first layer of silicon oxide;
   applying a first layer of resist to a first predetermined area of the first layer of polysilicon via masking, the first predetermined area substantially corresponding to a SRAM cell area;
   etching the first layer of polysilicon to leave only an area of polysilicon under the first layer of resist;
   stripping the first layer of resist;
   applying a second layer of resist to a logic area of the first layer of silicon oxide via masking;
   performing shallow trench silicon RIE at the SRAM cell area;
   stripping the second layer of resist;
   depositing a first layer of silicon nitride over the SRAM cell area and the logic area;
   applying a third layer of resist over the SRAM cell area and over each of a plurality of device areas in the logic area;
   performing silicon nitride RIE over the logic area;
   stripping the third layer of resist;
   depositing a second layer of silicon oxide over the SRAM cell area and the logic area;
   etching back the second layer of silicon oxide over the SRAM cell area, between the plurality of device areas in the logic area, and between the SRAM cell area and the adjacent device area;
   applying a fourth layer of resist over a portion of each of the plurality of device areas in the logic area;
   removing the exposed oxide over the SRAM cell area and around the sides of each of the plurality of devices not covered by resist;
   stripping the fourth layer of resist;
   performing silicon RIE between the plurality of device areas in the logic area and between the SRAM cell area and the adjacent device area;
   depositing a second layer of silicon nitride over the SRAM cell area and the logic area;
   performing a first chemical mechanical polishing step to remove all the deposited second layer of silicon down to about a top edge of the remaining first polysilicon layer;
   removing the first polysilicon layer;
   removing the exposed silicon oxide layer;
   epitaxially growing a first layer of silicon into the voids created by the steps of removing the first polysilicon layer and removing the exposed silicon oxide layer;
   performing a second chemical mechanical polishing step to remove all the deposited first layer of silicon down to about the same level as the first chemical mechanical polishing step;
   removing the second silicon nitride layer;
   depositing a third silicon oxide layer over the SRAM cell area and over a portion of each of the plurality of device areas;
   depositing a gate electrode substantially over the third silicon oxide layer;
   depositing a spacer layer adjacent the gate electrode and third silicon oxide layer;

depositing a silicide layer on the exposed first epitaxial silicon layer and over a portion of the gate electrode; and depositing contacts, each of said contacts in electrical connection with one of the silicide layers.

7. The method of claim 1, wherein the applying a fourth layer of resist is accomplished via shallow trench patterning.

8. The method of claim 1, wherein the removing the first polysilicon layer includes removing via RIE or wet etching.

9. The method of claim 1, wherein the removing the exposed silicon oxide layer includes removing via wet etching.

10. A method of making an SOI device with increased channel width in a full-depletion SRAM, comprising:

depositing a layer of epitaxial silicon on a SOI substrate, the SOI substrate having an oxide layer buried within;

depositing a gate electrode over the layer of epitaxial silicon;

depositing source and drain contact electrodes, the source and drain contact electrodes electrically coupled to silicide layers and disposed on opposing sides of the gate electrode.

11. The method of claim 10, wherein the source and drain contact electrodes are separated from the gate electrode by a spacer layer.

\* \* \* \* \*